(12) United States Patent
Petitdidier et al.

(10) Patent No.: US 11,183,468 B2
(45) Date of Patent: Nov. 23, 2021

(54) CHIP PROTECTED AGAINST BACK-FACE ATTACKS

(71) Applicant: STMicroelectronics (Crolles 2) SAS, Crolles (FR)

(72) Inventors: Sebastien Petitdidier, La Terrasse (FR); Nicolas Hotellier, Jarrie (FR); Raul Andres Bianchi, Myans (FR); Alexis Farcy, La Ravoire (FR); Benoît Froment, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 347 days.

(21) Appl. No.: 15/638,883

(22) Filed: Jun. 30, 2017

(65) Prior Publication Data

US 2018/0061781 A1  Mar. 1, 2018

(30) Foreign Application Priority Data

Aug. 31, 2016  (FR) ..................................... 1658070

(51) Int. Cl.
*H01L 23/00* (2006.01)
*H01L 49/02* (2006.01)
*H01L 23/498* (2006.01)
*H01L 23/64* (2006.01)
*H01L 23/58* (2006.01)
*H01L 23/48* (2006.01)
(Continued)

(52) U.S. Cl.
CPC ...... *H01L 23/576* (2013.01); *H01L 21/31111* (2013.01); *H01L 21/76802* (2013.01); *H01L 21/76831* (2013.01); *H01L 21/76877* (2013.01); *H01L 21/76898* (2013.01); *H01L 23/291* (2013.01); *H01L 23/3171* (2013.01); *H01L 23/481* (2013.01); *H01L 23/49855* (2013.01); *H01L 23/528* (2013.01); *H01L 23/5226* (2013.01); *H01L 23/57* (2013.01); *H01L 23/573* (2013.01); *H01L 23/585* (2013.01); *H01L 23/642* (2013.01); *H03K 3/3565* (2013.01); *H01L 23/293* (2013.01)

(58) Field of Classification Search
CPC ..... H01L 23/57; H01L 23/573; H01L 23/576; G06F 21/87

See application file for complete search history.

(56) References Cited

U.S. PATENT DOCUMENTS 7,884,625 B2 * 2/2011 Bartley .................. H01L 23/576
324/686
8,946,859 B2 * 2/2015 Lisart .................... H01L 21/763
257/48
(Continued)

FOREIGN PATENT DOCUMENTS

CN  101636826 A  1/2010
CN  103187379 A  7/2013
(Continued)

*Primary Examiner* — Bradley Smith
*Assistant Examiner* — David J Goodwin
(74) *Attorney, Agent, or Firm* — Slater Matsil, LLP

(57) ABSTRACT

A semiconductor chip includes at least two insulated vias passing through the chip from the front face to the rear face in which, on the side of the rear face, the vias are connected to one and the same conducting strip and, on the side of the front face, each via is separated from a conducting pad by a layer of a dielectric.

16 Claims, 5 Drawing Sheets

(51) Int. Cl.
*H01L 21/768* (2006.01)
*H01L 21/311* (2006.01)
*H01L 23/29* (2006.01)
*H01L 23/31* (2006.01)
*H01L 23/522* (2006.01)
*H01L 23/528* (2006.01)
*H03K 3/3565* (2006.01)

(56) References Cited

U.S. PATENT DOCUMENTS

| | | |
|---|---|---|
| 2007/0045780 A1 | 3/2007 | Akram et al. |
| 2007/0121575 A1* | 5/2007 | Savry .................. G06K 19/073 370/351 |
| 2009/0001821 A1* | 1/2009 | Walker .................. G06F 21/87 307/413 |
| 2010/0003767 A1 | 1/2010 | Cho |
| 2010/0026313 A1* | 2/2010 | Bartley ................ H01L 23/576 324/548 |
| 2010/0155796 A1 | 6/2010 | Koike et al. |
| 2010/0181645 A1 | 7/2010 | Marenco |
| 2010/0187525 A1 | 7/2010 | Bartley et al. |
| 2010/0187527 A1* | 7/2010 | Van Geloven ........ H01L 23/576 257/48 |
| 2013/0168868 A1 | 7/2013 | Ho et al. |
| 2015/0021675 A1 | 1/2015 | Min |
| 2015/0108606 A1* | 4/2015 | Lamy .................... H01L 23/481 257/532 |
| 2016/0211230 A1 | 7/2016 | Lamy et al. |
| 2016/0307855 A1* | 10/2016 | Charbonnier ......... H01L 23/573 |
| 2019/0035747 A1 | 1/2019 | Petitdidier |

FOREIGN PATENT DOCUMENTS

| | | |
|---|---|---|
| EP | 1427007 A2 | 6/2004 |
| EP | 2866259 A1 | 4/2015 |
| EP | 3046147 A2 | 7/2016 |
| JP | 2005277327 A | 10/2005 |

* cited by examiner

CHIP PROTECTED AGAINST BACK-FACE ATTACKS

CROSS-REFERENCE TO RELATED APPLICATIONS

This application claims priority to French Patent Application No. 1658070, filed on Aug. 31, 2016, which application is hereby incorporated herein by reference.

TECHNICAL FIELD

The present patent application relates to electronic chips, more particularly to electronic chips protected against attacks performed from the rear face.

BACKGROUND

Electronic chips containing confidential information, such as bank card chips, are liable to undergo attacks by hackers aimed at determining the operation of the chip and at extracting the confidential information therefrom.

The case is considered here where, in order to carry out an attack, a hacker hollows out a cavity from the rear face of the chip, for example, with an ion beam, while possibly having thinned the substrate previously. The hacker can then install in the cavity contacts with the components situated on the front face, and analyse the operation of the chip.

SUMMARY

Embodiments of the invention provide a chip that can resist these types of attacks. For example, an embodiment provides a semiconductor chip comprising at least two insulated vias passing through the chip from the front face to the rear face in which, on the side of the rear face, the vias are connected to one and the same conducting strip and, on the side of the front face, each via is separated from a conducting pad by a layer of a dielectric.

According to one embodiment, the chip comprises a plurality of elements such as hereinabove whose conducting strips are parallel to one another.

According to one embodiment, the conducting strip forms a serpentine on at least one portion of the surface of the rear face.

According to one embodiment, the chip comprises decoy conducting pads or decoy vias.

According to one embodiment, the rear face of the chip is uniformly covered with an insulating material.

According to one embodiment, the dielectric layer is silicon oxide.

According to one embodiment, the conducting strip is made of copper, titanium or aluminium.

According to one embodiment, the insulating material covering the rear face is a polymer or silicon oxide.

An embodiment provides for a method for fabricating a semiconductor chip comprising the following steps: formation of conducting pads on the front face of a substrate; thinning of the rear face; etching of openings under the conducting pads from the rear face, stopping when the conducting pad is reached; deposition of a layer of a dielectric on the walls and the bottom of the openings; and formation of a conducting layer in the openings and of a conducting strip linking the conducting layers together.

According to one embodiment, each conducting pad is an N-type doped region.

According to one embodiment, the N-type doped regions have a height of between 1 μm and 10 μm.

BRIEF DESCRIPTION OF THE DRAWINGS

These characteristics and advantages, together with others, will be set forth in detail in the following non-limiting description of particular embodiments, given in conjunction with the attached figures among which.

DETAILED DESCRIPTION OF ILLUSTRATIVE EMBODIMENTS

Like elements have been designated by like references in the various figures and, moreover, the diverse figures are not drawn to scale. For the sake of clarity, only the elements useful to the understanding of the embodiments described have been represented and are detailed.

In the description which follows, when reference is made to qualifiers of absolute position, such as the terms "front", "rear", etc., or relative position, such as the terms "upper", etc., reference is made to the orientation of the figures in a normal position of use. In the views from above, the elements depicted dashed are seen through transparency of the chip considered.

Figure 1A:
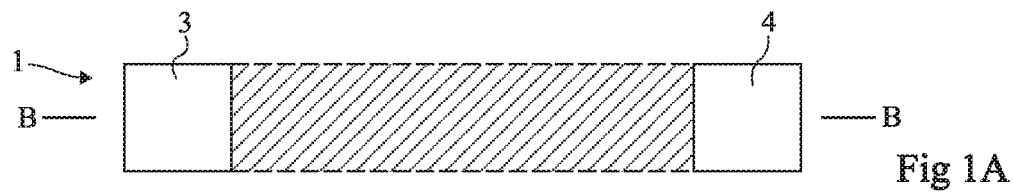
FIG. 1A is a view from above of an embodiment of a chip protected from rear face attacks.
Figure 1B:
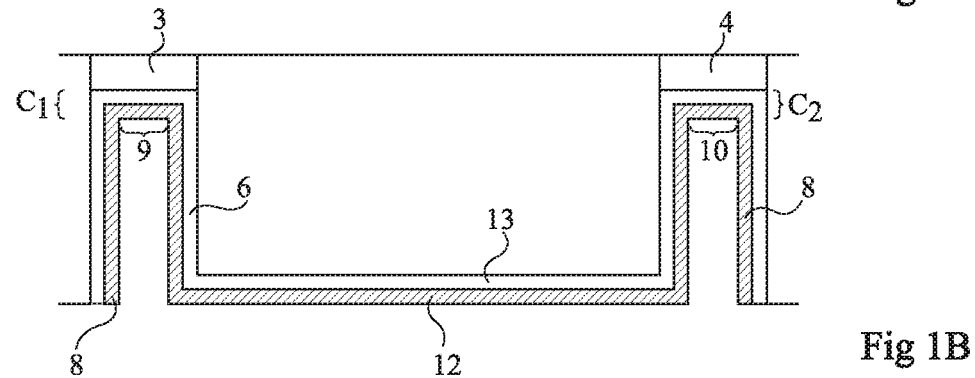
FIG. 1B is a sectional view on the line B-B of FIG. 1A.

FIG. 1A is a view from above of an embodiment of a semiconductor chip 1 protected from rear face attacks. FIG. 1B is a sectional view on the plane B-B of FIG. 1A. Two conducting pads 3 and 4 are formed on the front face of the chip 1. Opposite each of these conducting pads, openings have been formed from the rear face of the chip. These openings have thereafter been sheathed with a layer of a dielectric 6 covered with a conducting layer 8. Thus, the upper parts 9 and 10 of the conducting layer 8 are respectively opposite the conducting pads 3 and 4. Thus, there is a capacitor C1 between the pad 3 and the upper part 9 of the conducting layer 8 and a capacitor C2 between the pad 4 and the upper part 10 of the conducting layer 8. A conducting strip 12 extends over the rear face and connects the conducting layers 8 formed opposite the conducting pads 3 and 4. In the case where the substrate of the chip is made of a conducting material, the conducting strip 12 is separated from the substrate by an insulating layer 13.

Figure 1C:
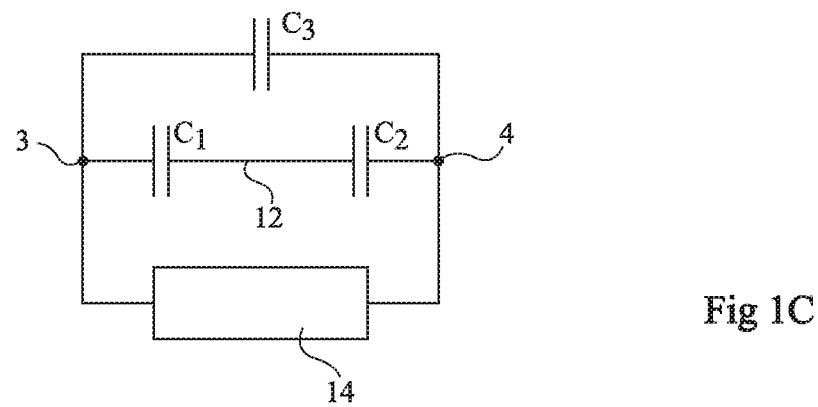
FIG. 1C is an equivalent electrical diagram.

As illustrated by FIG. 1C, there are, between the pads 3 and 4, two capacitors C1 and C2 connected in series by the strip 12. Also depicted is a capacitor C3 corresponding to diverse stray capacitances including the capacitance of direct coupling between the conducting pads 3 and 4. The capacitance of the capacitor C3 is normally much less than the value of the capacitance of the capacitors C1 and C2 in series. A capacimeter 14 measures the normal value of the set of capacitances C1, C2 and C3. If the connection consisting of the strip 12 between the capacitances C1 and C2 is cut, the value of the capacitance measured by the capacimeter drops abruptly. This device therefore makes it possible to detect any attack on the integrity of the conducting strip 12.

In a conventional manner, in order to carry out an analysis of the components situated between the pads 3 and 4, a hacker will attempt to thin the chip from the rear face. He will thus destroy the conducting strip 12 and this will be detected. Likewise, if the hacker performs a drilling which affects the strip 12, this will also be detected.

Figure 2:
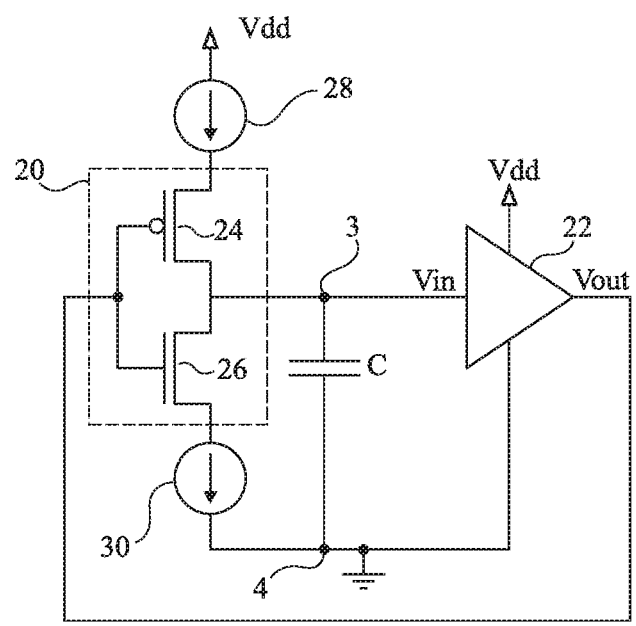
FIG. 2 represents the electrical diagram of an exemplary capacimeter.

FIG. 2 represents the electrical diagram of an exemplary capacimeter measuring the capacitance C between the terminals 3 and 4 of a capacitor. The terminal 4 is grounded and the terminal 3 is linked to a node between the output of an inverter 20 and the input of a Schmitt-trigger flip-flop 22 having high and low thresholds, Vhigh and Vlow. The output of the flip-flop 22 is connected to the input of the inverter 20. The output voltage of the flip-flop 22, Vout, can take two values, 0 and Vdd, provided to the flip-flop 22 by the ground and a fixed DC voltage source Vdd. The inverter 20 comprises two MOS transistors 24 and 26, respectively P channel and N channel. The transistor 24 links, via its conduction nodes, the output of a source 28 of current I and the node 3. The transistor 26 links, via its conduction nodes, the node 3 and the input of a source 30 of current I. Moreover, the input of the source 28 is linked to the DC voltage source Vdd and the output of the source 30 is grounded.

When the voltage Vin at the input of the flip-flop 22 and therefore across the terminals of the capacitor reaches the value Vlow, the flip-flop 22 toggles to a state such that its output Vout takes the value 0. The inverter 20 then toggles to a state such that the transistor 24 becomes passing, and the capacitor charges until Vin reaches the value Vhigh, triggering the change of state of the flip-flop 22 whose output toggles to Vdd. The inverter 20 then toggles to a state such that the transistor 26 becomes passing, and the capacitor discharges until Vin reaches the value Vlow, triggering the change of state of the flip-flop 22 whose output toggles to 0.

The capacitance C is measured by measuring the period T of the output signal of the flip-flop 22. The period T corresponds to a charging and a discharging at fixed current I of the capacitor C over a voltage span [Vlow, Vhigh]. The value of the capacitance C is therefore half the period T multiplied by the value I of the current and divided by the voltage difference ΔV=Vhigh−Vlow.

The protection device such as presented in conjunction with FIGS. 1A and 1B is in fact effective only for detecting a thinning of the chip or a drilling precisely targeting components placed between the two conducting pads 3 and 4.

Figure 3:
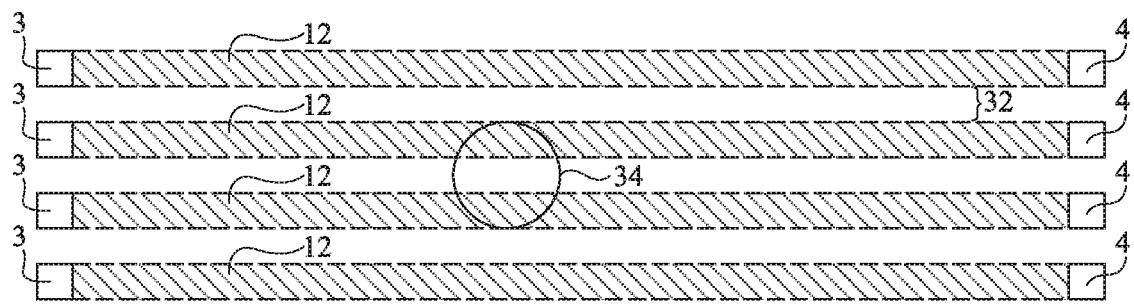
FIG. 3 is a view from above of an embodiment of a chip protected from rear face attacks.

In the structure of FIG. 3, structures such as that of FIGS. 1A and 1B have been repeated parallel to one another. Thus, FIG. 3 represents several conducting strips 12 extending over the rear face of the substrate between vias disposed opposite pads 3 and 4.

The width of the strips 12 and the distance 32 separating the strips 12 are determined by taking into account the minimum size of drill hole possible with existing technologies, in such a way that a drilling 34, whatever its location, cuts at least one connection between two conducting pads. At present the size of a drill hole is, for example, 3×3 μm².

The embodiment of FIG. 3 makes it possible to cover and therefore to protect a larger surface than the embodiment of FIGS. 1A and 1B. Moreover, monitoring the capacitance between each pair of pads 3 and 4 makes it possible to determine the location of the attack with a precision which depends on the density of pads.

Figure 4:
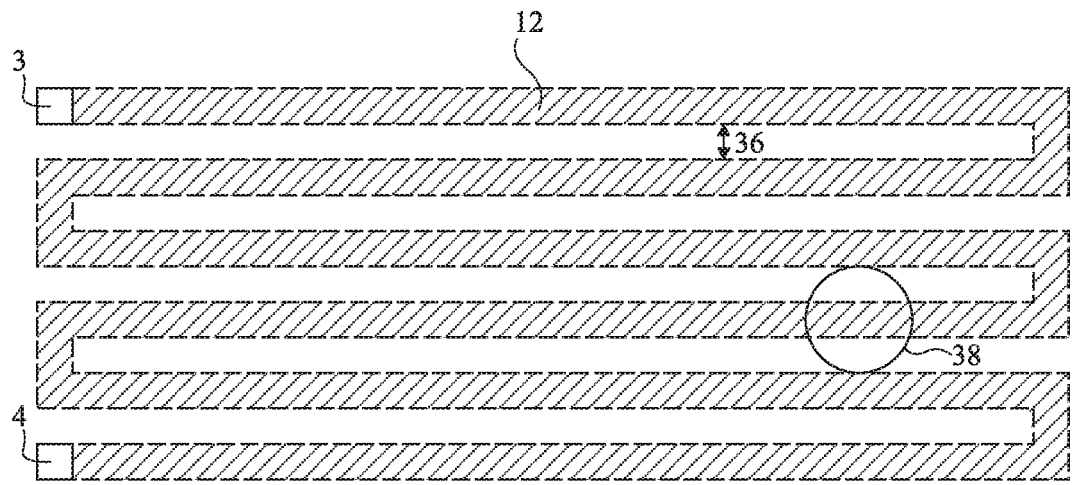
FIG. 4 is a view from above of another embodiment of a chip protected from rear face attacks.

FIG. 4 is a view from above of another embodiment of a chip protected from rear face attacks. A structure such as described in FIGS. 1A and 1B has been constructed on the chip, where the conducting strip 12 is prolonged as a serpentine shape under the surface to be protected. The dimensions of the serpentine, the width of the metallic strip 12, and also the distance 36 between two neighbouring parts of the conducting strip 12 are determined by taking into account the minimum size of drill hole possible with existing technologies, in such a way that a drilling 38, whatever its location, cuts the connection between the conducting pads. This configuration makes it possible to detect, through a single measurement of capacitance, attempted drilling over the whole of the surface to be protected.

Figure 5:
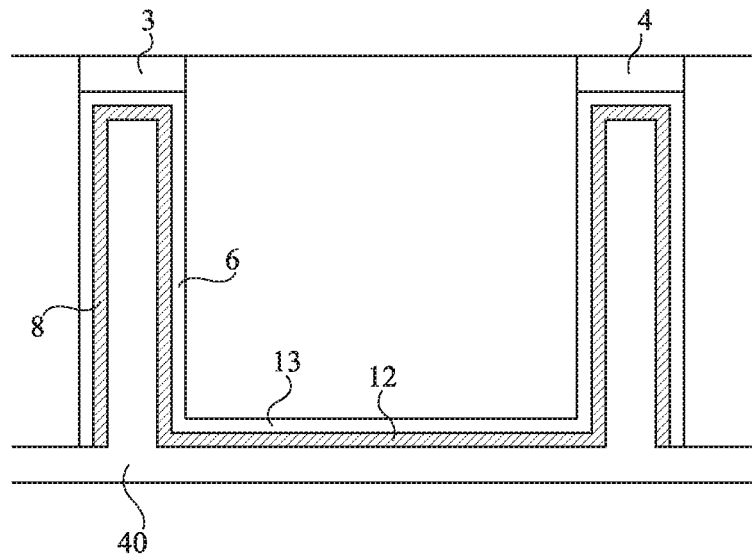
FIG. 5 is a sectional view of another embodiment of a chip protected from rear face attacks.

FIG. 5 is a sectional view of another embodiment of a chip protected from rear face attacks. The rear face of a structure such as that of FIG. 1B is covered uniformly with an insulating material 40 which fills the openings opposite the conducting pads 3 and 4. This filling serves, for example, to rigidify the structure mechanically, to improve opacity or to disturb rear face polishing or chemical attacks. Moreover, the presence of the material 40 on the rear face masks the presence of the conducting strips 12. By way of example, the filling material can be a polymer or a silicon oxide.

A hacker seeking to analyse the components of a semiconductor chip and being aware of the existence and the nature of a protection system will be able to use this information to seek to violate the protection system. It is proposed here to render awareness of the protection system more difficult by incorporating decoys thereinto.

Figure 6:
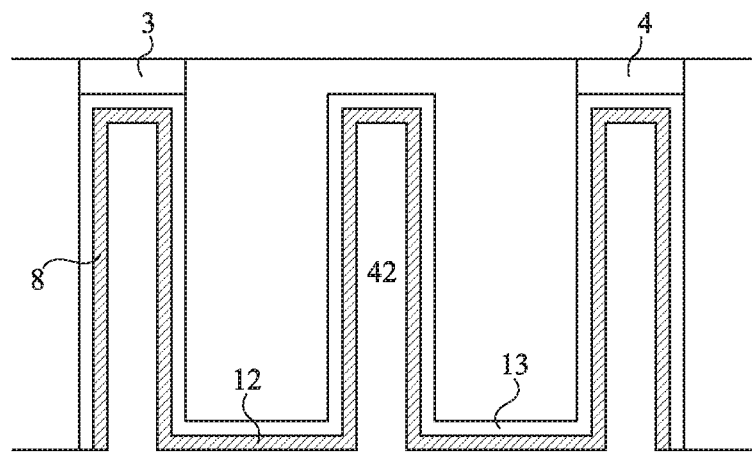
FIG. 6 is a sectional view of another embodiment of a chip protected from rear face attacks.

FIG. 6 illustrates a first type of decoy. An opening 42 on the rear face is formed in the same manner as the openings hollowed out under the pads 3 and 4, but is not situated opposite a conducting pad. It is, moreover, connected to the strip 12 in such a way that it forms part of the connection between the two electrodes 3 and 4.

Figure 7:
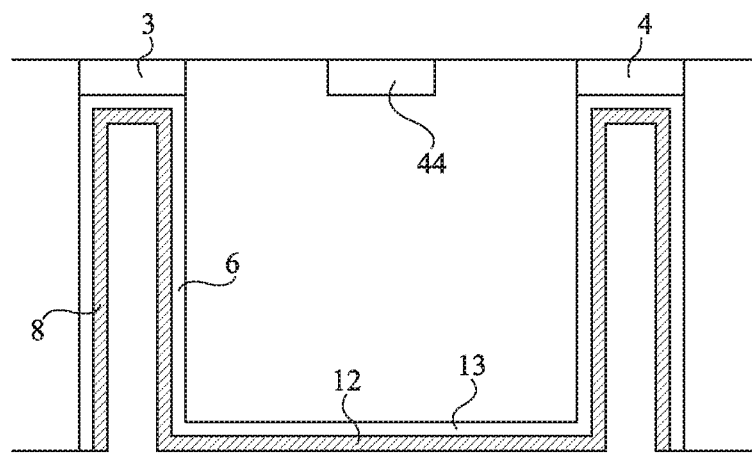
FIG. 7 is a sectional view of another embodiment of a chip protected from rear face attacks.

FIG. 7 illustrates a second type of decoy. A conducting pad 44 is disposed on the front face but is not opposite a via linked to a conducting strip on the rear face. The pad 44 is placed among the components of the circuit. An analysis of this component on the front face will not give any information about the protection device.

The chip protection device such as described in conjunction with FIGS. 1A and 1B can be fabricated in diverse ways. FIGS. 8A to 8D illustrate successive steps of a method for fabricating this device.

Figure 8A:
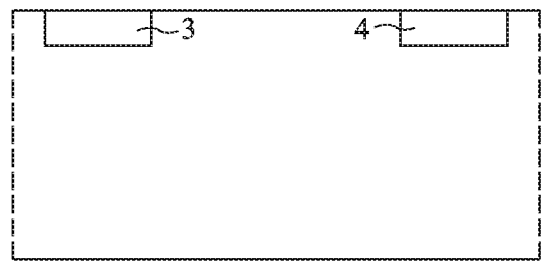
FIGS. 8A to 8D are sectional views illustrating successive steps of a method for fabricating a chip protected from rear face attacks.

FIG. 8A illustrates the formation of conducting pads 3 and 4 on the front face of a semiconductor chip. The pads are, for example, formed by high-dose dopant implantation. After this, the die is thinned down from its rear face, for example, down to a thickness of 100 to 200 μm, for example, 140 μm.

Figure 8B:
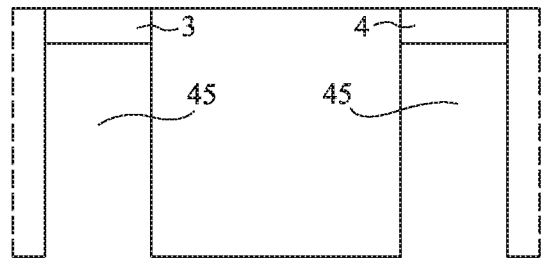

FIG. 8B illustrates the etching of an opening 45 under each conducting pad 3 or 4 from the rear face, stopping when the conducting pad is reached.

Figure 8C:
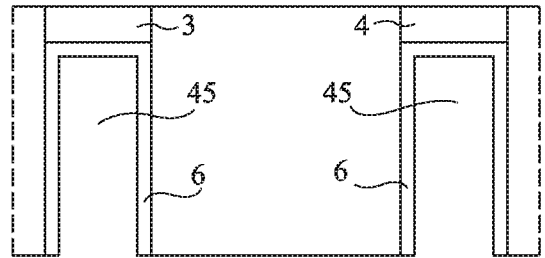

FIG. 8C illustrates the deposition of a layer of a dielectric 6 on the walls and the bottom of the openings 45. In this embodiment, the dielectric 6 situated outside of the openings 45 has been removed.

Figure 8D:
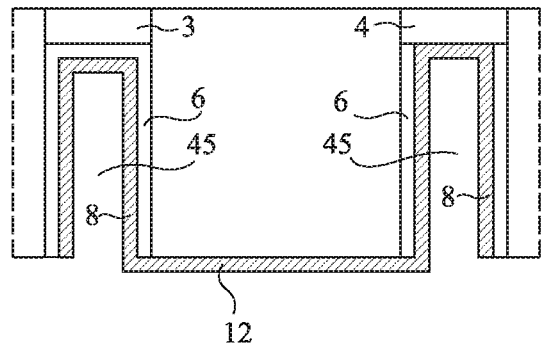

FIG. 8D illustrates the deposition of a conducting layer 8 in the openings 45. This layer is held on the rear face as a conducting strip 12 which links the conducting layers 8 together.

Figure 9A:
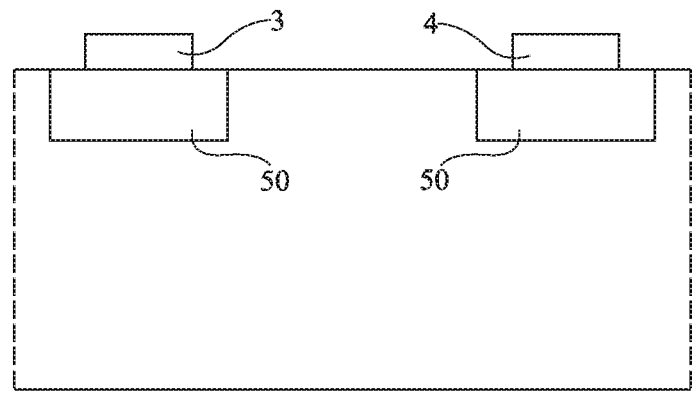
FIGS. 9A and 9B are sectional views illustrating successive steps of another method for fabricating a chip protected from rear face attacks.
Figure 9B:
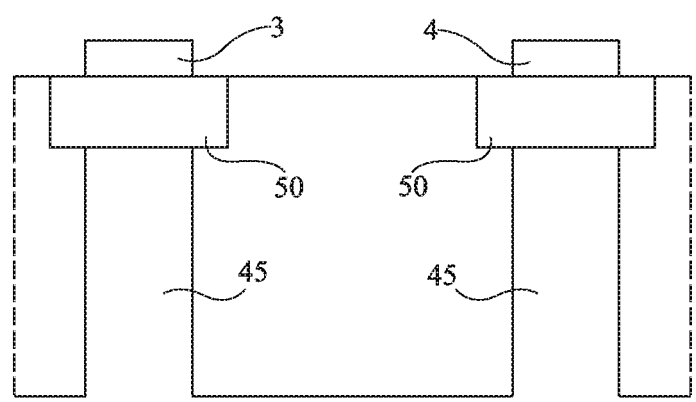

FIGS. 9A and 9B illustrate steps of another fabrication method.

FIG. 9A illustrates insulating wells STI (standing for "Shallow Trench Isolation") 50 formed on the front face. Conducting pads 3 and 4 are formed on the wells 50. The pads 3 and 4 are, for example, polysilicon pads formed at the same time as the MOS transistor gates, or tungsten pads, formed at the same time as the MOS transistor electrical contacts.

The following step, illustrated by FIG. 9B, corresponds to the step previously described in conjunction with FIG. 8B: the formation of openings 45 opposite the conducting pads, but now stopping when the openings reach the wells STI 50. By way of variant, the formation of the openings 45 can comprise a step of etching a part of the thickness of the dielectric material forming the wells STI 50.

The last steps, the deposition of a dielectric layer and the deposition of a conducting layer, are similar to the steps of the method described in conjunction with FIGS. 8C and 8D.

By way of example, the dielectric 6 can be silicon oxide and the conductor 8 copper, titanium or aluminium.

It will be understood that the two methods described here are susceptible of numerous variants. It will be possible to use other methods to achieve the desired result.

Particular embodiments have been described. Diverse variants and modifications will be apparent to the person skilled in the art. In particular, the number of conducting pads 3 and 4 and the shape of the conducting strips 12 linking them to one another can vary in so far as any rear face drilling cuts at least one connection between two conducting pads linked together by a capacimeter. The conducting strip, instead of having a serpentine shape, may take the shape of a spiral, or more generally that of any space-filling curve whatsoever, such as, for example, a Peano curve or a Koch curve, extending over a portion of surface to be protected of the rear face of the chip, in such a way that a drilling, whatever its location on the surface to be protected, cuts the conducting strip. Comb structures can also be used.

Diverse embodiments with diverse variants have been described hereinabove. It will be noted that the person skilled in the art will be able to combine diverse elements of these diverse embodiments and variants without showing evidence of inventive step.

What is claimed is:

1. A semiconductor chip comprising:
    a chip substrate having a front face and a rear face opposite the front face, active circuitry being disposed at the front face;
    a plurality of insulated vias extending between the front face and the rear face of the chip substrate, wherein, at the rear face, each via is connected to a common conducting strip, and wherein, at the front face, each via comprises a bottom insulated surface and a bottom conducting surface; and
    a plurality of capacitors, wherein each capacitor of the plurality of capacitors comprises
        a first conductor formed from a conducting pad directly overlying an associated via of the plurality of insulated vias,
        a second conductor formed from the bottom conducting surface of the associated insulated via, and
        a dielectric formed from the bottom insulated surface of the associated insulated via, the dielectric being disposed directly between the first conductor and the second conductor to form the capacitor.

2. The semiconductor chip according to claim 1, further comprising a second plurality of insulated vias extending between the front face and the rear face of the chip substrate, wherein, at the rear face, each via of the second plurality of insulated vias is connected to a second common conducting strip and wherein, on the front face, each via of the second plurality of insulated vias is separated from an associated conducting pad by a second associated region of dielectric.

3. The semiconductor chip according to claim 1, wherein the common conducting strip includes a serpentine portion on rear face.

4. The semiconductor chip according to claim 1, further comprising decoy conducting pads at the front face.

5. The semiconductor chip according to claim 1, further comprising decoy conducting vias at the front face.

6. The semiconductor chip according to claim 1, further comprising an insulating material uniformly covering the rear face of the chip substrate.

7. The semiconductor chip according to claim 1, wherein each region of dielectric comprises silicon oxide.

8. The semiconductor chip according to claim 1, wherein the common conducting strip comprises copper, titanium or aluminum.

9. The semiconductor chip according to claim 1, further comprising a capacimeter coupled between a first conducting pad and a second conducting pad.

10. The semiconductor chip according to claim 9, wherein the capacimeter comprises:
    an inverter with an input and an output that is coupled to the first conducting pad;
    a Schmitt-trigger flip-flop with an input coupled to the first conducting pad and an output coupled to the input of the inverter; and
    a ground terminal coupled to the second conducting pad.

11. The semiconductor chip according to claim 1, further comprising circuitry disposed at the front face, the circuitry configured to store or process confidential information.

12. A semiconductor chip comprising:
    a chip substrate having a front face and a rear face opposite the front face, active circuitry being disposed at the front face;
    a plurality of conducting pads including a first conducting pad and a second conducting pad;
    a plurality of insulated vias extending between the front face and the rear face of the chip substrate, wherein, at the rear face, each via is connected to a common conducting strip and wherein, at the front face, each via is separated from an associated one of the conducting pads by a layer of an associated region of dielectric; and
    means for measuring a capacitance between the first conducting pad and the second conducting pad, wherein the existence of a hack attempt can be determined when the measured capacitance is higher than a threshold capacitance value and wherein the absence of a hack attempt can be determined when the measured capacitance is lower than the threshold capacitance value.

13. The semiconductor chip according to claim 12, further comprising circuitry disposed at the front face, the circuitry configured to store or process confidential information.

14. The semiconductor chip according to claim 12, wherein the means for measuring the capacitance comprises a circuit comprising an inverter with an input and an output that is coupled to the first conducting pad and a Schmitt-trigger flip-flop with an input coupled to the first conducting pad and an output coupled to the input of the inverter.

15. A semiconductor chip comprising:
   a chip substrate having a front face and a rear face opposite the front face, active circuitry being disposed at the front face;
   a plurality of insulated vias extending between the front face and the rear face of the chip substrate, wherein, at the rear face, each via is connected to a common conducting strip and wherein, at the front face, each via is separated from an associated conducting pad by a layer of an associated region of dielectric; and
   a capacimeter coupled between a first conducting pad and a second conducting pad.

16. The semiconductor chip according to claim 15, wherein the capacimeter comprises:
   an inverter with an input and an output that is coupled to the first conducting pad;
   a Schmitt-trigger flip-flop with an input coupled to the first conducting pad and an output coupled to the input of the inverter; and
   a ground terminal coupled to the second conducting pad.

\* \* \* \* \*